US012750014B2

(12) United States Patent
Lee et al.

(10) Patent No.: US 12,750,014 B2
(45) Date of Patent: Sep. 29, 2026

(54) RF CIRCUIT FOR PREVENTING DAMAGE TO POWER AMPLIFIER

(71) Applicant: Samsung Electronics Co., Ltd., Gyeonggi-do (KR)

(72) Inventors: Yousung Lee, Gyeonggi-do (KR); Dongil Yang, Gyeonggi-do (KR); Yohan Moon, Gyeonggi-do (KR); Hyoseok Na, Gyeonggi-do (KR); Taeyoung Kim, Gyeonggi-do (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 444 days.

(21) Appl. No.: 18/369,943

(22) Filed: Sep. 19, 2023

(65) Prior Publication Data

US 2024/0097622 A1 Mar. 21, 2024

Related U.S. Application Data

(63) Continuation of application No. PCT/KR2023/014181, filed on Sep. 19, 2023.

(30) Foreign Application Priority Data

Sep. 19, 2022 (KR) ........................ 10-2022-0117839
Oct. 28, 2022 (KR) ........................ 10-2022-0141518

(51) Int. Cl.
*H03F 1/12* (2006.01)
*H03F 1/30* (2006.01)
(Continued)

(52) U.S. Cl.
CPC ................. *H03F 1/52* (2013.01); *H03F 1/30* (2013.01); *H03F 3/245* (2013.01); *H03F 2200/451* (2013.01)

(58) Field of Classification Search
CPC ..................................... H03F 1/12; H03F 1/52
(Continued)

(56) References Cited

U.S. PATENT DOCUMENTS 4,321,523 A * 3/1982 Hammel .................. H02J 7/96 320/DIG. 14
6,208,202 B1 * 3/2001 Kaufman ............... H03F 3/602 330/51
(Continued)

FOREIGN PATENT DOCUMENTS

EP 2 615 717 A2 7/2013
JP 2008-124715 A 5/2008
(Continued)

OTHER PUBLICATIONS

International Search Report dated Dec. 21, 2023.

*Primary Examiner* — Henry Choe
(74) *Attorney, Agent, or Firm* — Sughrue Mion, PLLC

(57) ABSTRACT

According to an embodiment, a Radio Frequency (RF) circuit comprises: a power amplifier; a switching circuit configured to electrically connect the power amplifier to a first switch in case that an output voltage of the power amplifier does not exceed a threshold voltage and to electrically connect the power amplifier to a terminating resistor in case that the output voltage of the power amplifier exceeds the threshold voltage; a first electrical path formed between the power amplifier and the switching circuit; and a first diode connected to a second electrical path formed from a first point of the first electrical path to the switching circuit, the first diode connected between the first point and the switching circuit.

20 Claims, 9 Drawing Sheets

(51) Int. Cl.
*H03F 1/52* (2006.01)
*H03F 3/24* (2006.01)

(58) Field of Classification Search
USPC .......................................... 330/51, 207 P, 298
See application file for complete search history.

(56) References Cited

U.S. PATENT DOCUMENTS

| | | | | |
|---|---|---|---|---|
| 8,330,537 | B1 * | 12/2012 | Ghorpade | H03F 3/45192 330/136 |
| 2006/0197594 | A1 | 9/2006 | Scuderi et al. | |
| 2007/0075782 | A1 | 4/2007 | Nakai | |
| 2008/0111631 | A1 | 5/2008 | Shiikuma | |
| 2011/0043956 | A1 | 2/2011 | Su et al. | |
| 2015/0155832 | A1 | 6/2015 | Onizuka et al. | |
| 2016/0248387 | A1 | 8/2016 | Kim et al. | |
| 2016/0336904 | A1 | 11/2016 | Ivanov et al. | |
| 2021/0376642 | A1 | 12/2021 | Gu et al. | |
| 2022/0060160 | A1 | 2/2022 | Gruner et al. | |
| 2022/0209728 | A1 | 6/2022 | Kim et al. | |
| 2022/0416681 | A1 * | 12/2022 | Telefus | H05B 45/10 |
| 2023/0067227 | A1 * | 3/2023 | Telefus | H02M 1/0003 |
| 2023/0327612 | A1 | 10/2023 | Moon et al. | |

FOREIGN PATENT DOCUMENTS

| | | | |
|---|---|---|---|
| JP | 2014-39109 | A | 2/2014 |
| KR | 10-2006-0092702 | A | 8/2006 |
| KR | 10-2016-0103335 | A | 9/2016 |
| KR | 10-2021-0146571 | A | 12/2021 |
| KR | 10-2022-0094935 | A | 7/2022 |
| WO | 2016/042689 | A1 | 3/2016 |
| WO | 2022/182045 | A1 | 9/2022 |

* cited by examiner

RF CIRCUIT FOR PREVENTING DAMAGE TO POWER AMPLIFIER

CLAIM OF PRIORITY

This application is a continuation of International Application No. PCT/KR2023/014181 designating the United States, filed on Sep. 19, 2023, in the Korean Intellectual Property Receiving Office and claiming priority to Korean Patent Application No 10-2022-0117839, filed Sep. 19, 2022 in the Korean Intellectual Property Office and Korean Patent Application No. 10-2022-0141518 filed Oct. 28, 2022 in the Korean Intellectual Property Office. Each of the foregoing are incorporated by reference for all purposes.

BACKGROUND

1. Technical Field

The disclosure relates to an RF circuit for preventing damage to a power amplifier.

2. Related Art

As mobile communication technology evolves, multi-functional portable terminals are commonplace. To meet increasing demand for radio traffic, 5G communication systems may be used. To achieve a higher data transmission rate, 5G communication systems can be implemented on ultra-high frequency bands as well as those used for 3G communication systems and long-term evolution (LTE) communication systems.

For example, to mitigate pathloss on the mmWave band and increase the reach of radio waves, the following techniques can be used with t5G communication systems: beamforming, massive multi-input multi-output (MIMO), full dimensional MIMO (FD-MIMO), array antenna, analog beamforming, and large scale antenna.

To transmit a signal from an electronic device to a communication network (e.g., a base station), data generated from a processor or a communication processor in the electronic device may be signal-processed through a radio frequency integrated circuit (RFIC) and radio frequency front-end (RFFE) circuit and then transmitted to the outside of the electronic device through at least one antenna. The electronic device may include at least one antenna to transmit signals of various frequency bands. At least one antenna may be configured to support signals of a plurality of frequency bands based on a multiplexer. The electronic device may determine the output of the power amplifier inside the RFFE circuit based on the maximum transmit power allowed for stable communication at the cell edge.

SUMMARY

According to an embodiment, a Radio Frequency (RF) circuit comprises: a power amplifier; a switching circuit configured to electrically connect the power amplifier to a first switch in case that an output voltage of the power amplifier does not exceed a threshold voltage and to electrically connect the power amplifier to a terminating resistor in case that the output voltage of the power amplifier exceeds the threshold voltage; a first electrical path formed between the power amplifier and the switching circuit; and a first diode connected to a second electrical path formed from a first point of the first electrical path to the switching circuit, the first diode connected between the first point and the switching circuit.

According to certain embodiments, an RF circuit comprises: a power amplifier; a switching circuit configured to electrically connect a driving amplifier to a terminating resistor in case that an output voltage of the power amplifier exceeds a threshold voltage, wherein the driving amplifier is electrically connected to an input of the power amplifier; a first switch configured to receive an output signal of the power amplifier; a first electrical path formed between the power amplifier and the first switch; and a first diode connected to a second electrical path formed from a first point of the first electrical path to the switching circuit, and connected between the first point and the switching circuit.

An embodiment of the disclosure is not limited to the foregoing objectives, and other objectives would readily be appreciated by a skilled artisan from the following detailed description taken in conjunction with the accompanying drawings.

DETAILED DESCRIPTION

Figure 1:
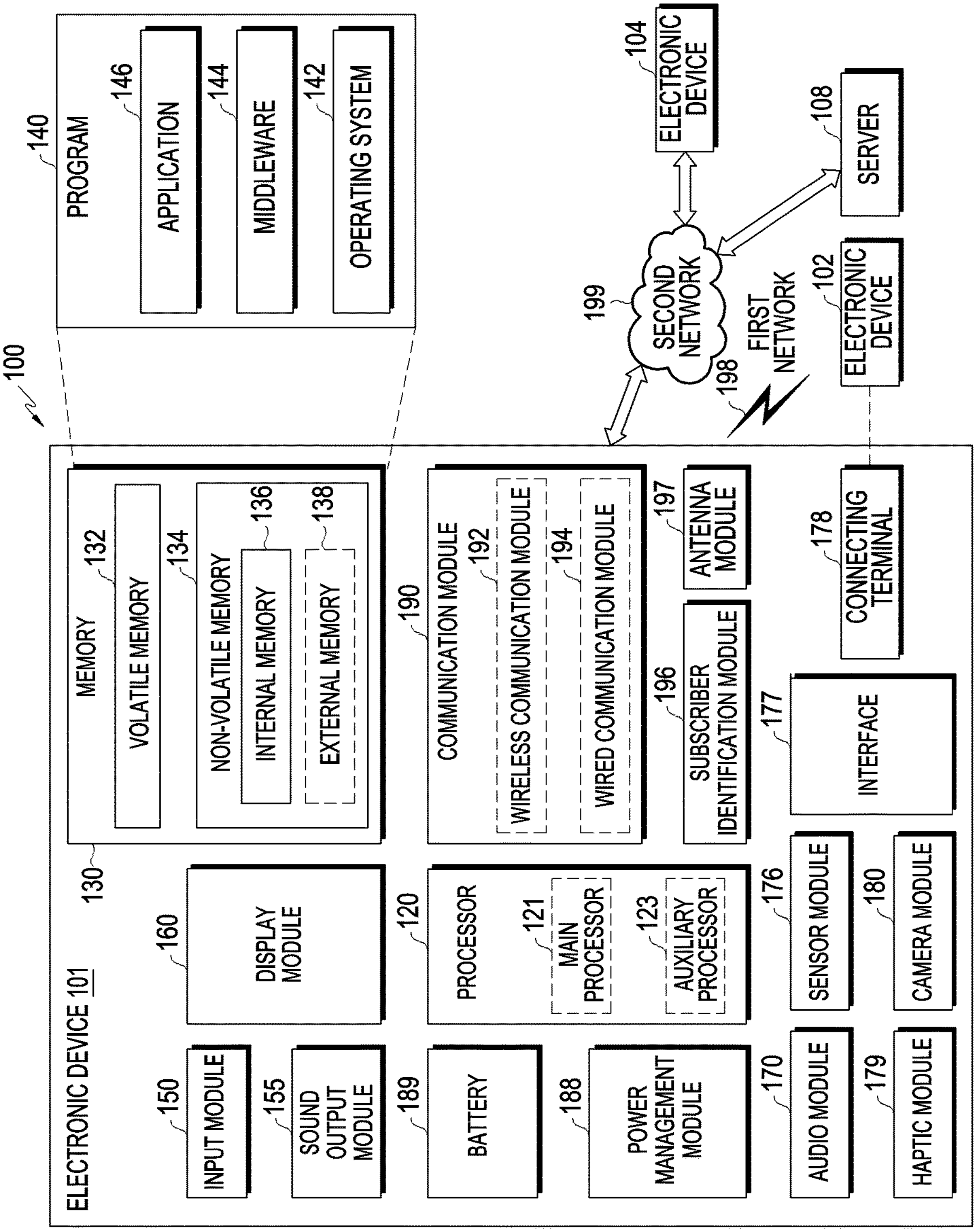
FIG. 1 is a block diagram illustrating an electronic device in a network environment according to an embodiment of the disclosure.

FIG. 1 is a block diagram illustrating an electronic device 101 in a network environment 100 according to an embodiment of the disclosure.

Referring to FIG. 1, the electronic device 101 in the network environment 100 may communicate with at least one of an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In an embodiment, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an accelerometer, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module).

A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include an antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to an embodiment, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or health-care) based on 5G communication technology or IoT-related technology.

It is noted that the electronic device 101 may transmit and receive signals from a cellular network via the antenna module 197. In order to transmit a radio signal, the electronic device 101 may use a power amplifier to amplifying a radio signal provided to the antenna module 197.

In a cellular network, a number of base stations are deployed, where each base station provides radio coverage for a surrounding area, known as a cell. When the electronic device 101 approaches the edge of the cell, the distance between the electronic device 101 and the base station may increase. Accordingly, the electronic device 101 may increase the power of the output radio signal by increasing the input voltage to the power amplifier. The foregoing may increase to the maximum output voltage at which the power amplifier is operable. For a variety of reasons, the power amplifier 210 providing a maximum output voltage may result in an impedance mismatch between the power amplifier and the antenna module 197. The impedance mismatch may potentially destroy the power amplifier.

Figure 2:
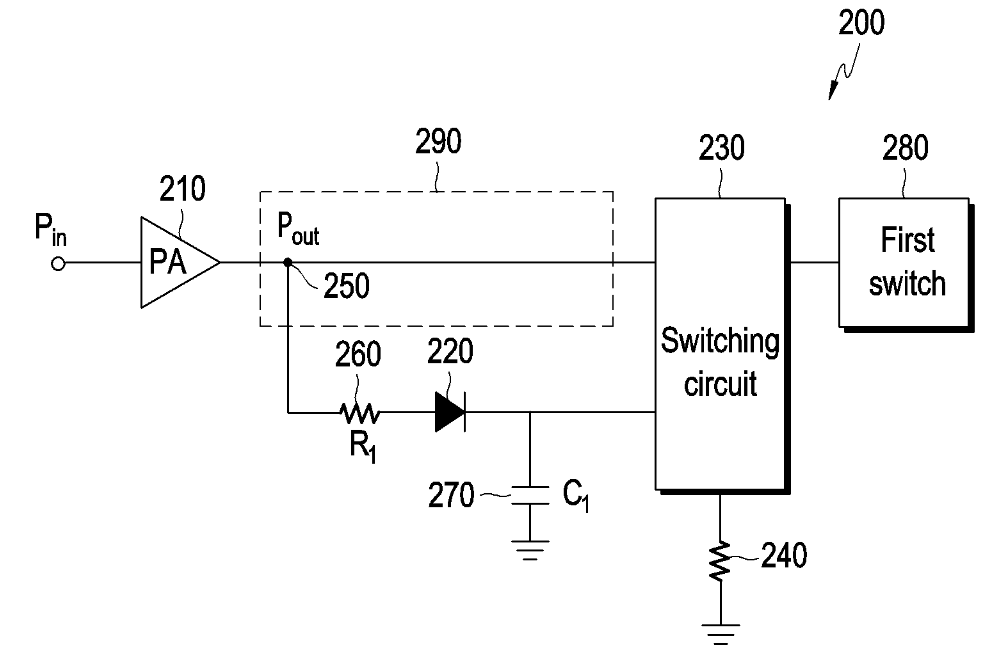
FIG. 2 is a view illustrating an RF circuit including a switching circuit according to an embodiment of the disclosure.

FIG. 2 provides a RF circuit 200 that prevents destruction of the power amplifier 210. A switch circuiting 230 can selectively connect the output of the power amplifier 210 to ground via a terminating resistance 240, when the output voltage of the power amplifier 210 exceeds a threshold.

FIG. 2 is a view illustrating an RF circuit 200 including a switching circuit 230 according to an embodiment of the disclosure.

When the output of the power amplifier 210 exceeds a threshold voltage by a reflected wave, the RF circuit 200 may prevent damage to the power amplifier 210 using the switching circuit 230. In an embodiment, the threshold voltage may be a maximum output voltage at which the power amplifier 210 may normally operate.

Referring to FIG. 2, the RF circuit 200 may include a power amplifier 210, a switching circuit 230, and a first diode 220. The power amplifier 210 may be connected to a switching circuit 230 by an electrical path 290. A resistor 260 in series with the first diode 220 are connected between a point 250 of the electrical path 290 and the switching circuit 230.

The power amplifier 210 may amplify an input signal based on a set gain. The output signal from the power amplifier 210 may be transmitted to the switching circuit 230 or the first switch 280 through a first electrical path 290. In an embodiment, the output signal of power amplifier 210 may be an RF signal.

The output voltage of the power amplifier 210 may operate an antenna switch module (e.g., the antenna module 197 of FIG. 1) included in a wireless communication module (e.g., the wireless communication module 192 of FIG. 1) of the electronic device (e.g., the electronic device 101 of FIG. 1). As the position of the electronic device 101 approaches the cell edge of the base station, the distance between the electronic device 101 and the base station may increase. The electronic device 101 may increase the output voltage of the power amplifier 210 by increasing the voltage input to the power amplifier 210 to stably perform wireless communication at the cell edge. The output voltage of the power amplifier 210 may increase to the maximum output voltage at which the power amplifier 210 is normally operable.

When the output voltage of the power amplifier 210 increases to the maximum output voltage, an impedance mismatch may occur between the output end of the power amplifier 210 and the input end of the antenna switch module, for a variety of reasons. For example, the impedance mismatch may occur due to a signal reflected by an antenna load (not shown). The impedance mismatch may occur due to a reflected signal due to an error in the on-off timing of the first switch 280 connected between the power amplifier 210 and the antenna. An impedance mismatch may occur due to the reflected signal of an unwanted signal input to the power amplifier 210 by a filter (not shown) connected to the output end of the power amplifier 210. The unwanted signal input to the power amplifier 210 may occur because a phase locked loop (PLL) is not locked at the output end of the transceiver. As the output voltage of the power amplifier 210 increases, the amplitude of the reflected signal may increase due to the impedance mismatch.

The output voltage of the power amplifier 210 may exceed a threshold voltage when the amplitude of the reflected signal increases. For example, when impedance matching is normally performed between the power amplifier 210 and the antenna switch module, the value of the voltage standing waver ratio (VSWR) may be 1. Accordingly, switching circuit 230 may connect the output of the power amplifier 210 to ground via terminating resistance 240.

If not for the switching circuit 230, when an impedance mismatch between the power amplifier 210 and the antenna switch module occurs, the value of VSWR would possibly increase to 10. When the VSWR value is 10, the power output by the power amplifier 210 would increase by about 5 dBm or more in a specific phase as compared to when the VSWR value is 1. If the output voltage of the power amplifier 210 exceeds the threshold voltage, permanent loss of the power amplifier 210 may occur causing wireless communication of the electronic device 101 may fail.

Accordingly, the RF circuit 200 according to an embodiment of the disclosure may prevent permanent loss of the power amplifier 210 when a voltage having a magnitude that is not protected by an over voltage protection (OVP) circuit or an over current protection (OCP) circuit is output by the power amplifier 210 according to the operation of the switching circuit 230.

The switching circuit 230 may electrically connect the power amplifier 210 to the first switch 280 when the output voltage of the power amplifier 210 does not exceed the threshold voltage. The signal output from the power amplifier 210 may be transmitted through a first electrical path 290 formed between the power amplifier 210 and the switching circuit 230.

The switching circuit 230 may be configured to electrically connect the power amplifier 210 to the terminating resistance 240 when the output voltage of the power amplifier 210 exceeds the threshold voltage. In an embodiment, the output voltage of the power amplifier 210 may be a voltage that causes the switching circuit 230 to operate. In an embodiment, the resistance value of terminating resistance 240 may be about 50 ohms. The specific numerical value of the resistance value of the terminating resistance 240 is not limited to the above-described example, and other resistances may be used. In an embodiment, the switching circuit 230 may connect the power amplifier 210 to the ground (GND) through the terminating resistance 240 when the output voltage of the power amplifier 210 exceeds the threshold voltage. Connects the power amplifier 210 to the ground may prevent damage to the power amplifier 210 from overvoltage.

In an embodiment, the first diode 220 may be connected by a second electrical path formed from the first point 250 of the first electrical path 290 to the switching circuit 230. The diode may be connected between the first point 250 and the switching circuit 230. The foregoing shall now be referred to as "branched." The first point 250 may be referred to as "the output end of the power amplifier 210" in this disclosure. The operating state of the first diode 220 may be a turn-off state (unbiased) when the output voltage of the power amplifier 210 is less than the voltage $V_d$ at which the first diode 220 is operable. The first diode 220 may be turned on (forward biased) when the output voltage of the power amplifier 210 is equal to or greater than the voltage $V_d$ at which the first diode 220 is operable. As the first diode 220 is turned on, the switching circuit 230 may connect the power amplifier 210 with the terminating resistance 240, preventing damage to the power amplifier 210 from overvoltage.

According to an embodiment of the disclosure, the RF circuit 200 may be configured to further include a first resistor ($R_1$) 260 connected between the first point 250 and the first diode 220. The resistance value of the first resistor 260 may be determined based on a maximum output voltage at which the power amplifier 210 may normally operate. For example, as the resistance value of the first resistor 260 increases, the output voltage of the power amplifier 210 for turning on the first diode 220 may increase.

According to an embodiment of the disclosure, the RF circuit 200 may be configured to be branched from an electrical path connecting the first diode 220 to the switching circuit 230 and further include a first capacitor ($C_1$) 270 connected between the first diode 220 and the ground. In an embodiment, the first capacitor 270 may bypass the AC signal output by the power amplifier 210 when the first diode 220 is turned on. The switching circuit 230 may receive a DC signal output by the power amplifier 210 according to the operation of the first capacitor 270.

Figure 3:
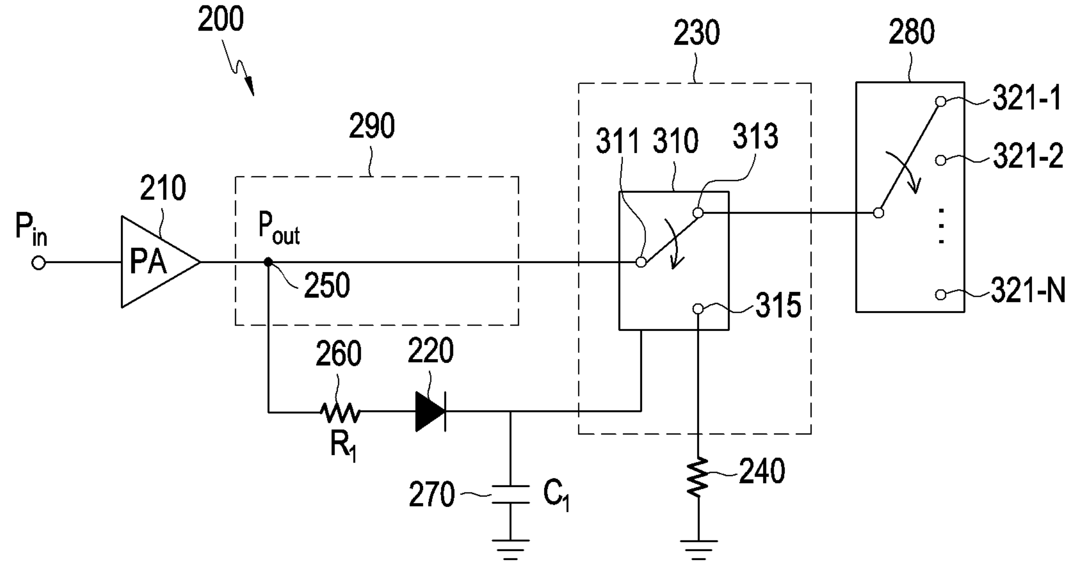
FIG. 3 is a view illustrating an RF circuit including a switching circuit implemented with an SPDT switch, according to an embodiment of the disclosure.

FIG. 3 is a view illustrating an RF circuit 200 including a switching circuit 230 implemented with a Single Pole Double Throw (SPDT) switch 310, according to an embodiment of the disclosure.

The power amplifier may be connected to a common port 311. The SPDT switch 310 may connect common port 311 to either first port 313 or second port 315. The first port 311 is connected to the first switch 280. The second port 315 may be connected to the terminating resistance 240. The SPDT switch 310 can be controlled based on whether the diode 220 is turned on. When the diode 220 is turned on, the common port 311 may be connected to the second port 315 (which is connected to the terminating resistance 240). When the diode 220 is turned off, the SPDT switch 310 may connect common port 311 to the third port 313 (which is connected to the first switch 280).

Accordingly, the diode 220 and resistance of resistor R1 can be selected such that the diode 220 turns on, when the output voltage of the power amplifier 210 exceeds the threshold.

According to an embodiment, the RF circuit 200, when the output of the power amplifier 210 exceeds the threshold voltage by the reflected wave, may prevent damage the power amplifier 210 based on the switching of the SPDT switch 310.

Referring to FIG. 3, according to an embodiment of the disclosure, the RF circuit 200 may include a power amplifier 210, an SPDT switch 310, and a first diode 220.

The power amplifier 210 may amplify an input signal based on a set gain. The output signal amplified by the power amplifier 210 may be transmitted to the terminating resistor 240 or the first switch 280 through the first electrical path 290 depending on the switching of the SPDT switch 310.

In an embodiment, the switching circuit 230 (e.g., the switching circuit 230 of FIG. 2) may include the SPDT switch 310. The SPDT switch 310 may include a common port 311, a first port 313, and a second port 315. The common port 311 may be connected to the power amplifier 210 through the first electrical path 290. The first port 313 may be connected to the first switch 280. The second port 315 may be connected to the terminating resistance 240. The SPDT switch 310 performs a switching operation by the common port 311 to either the first port 313 or the second port 315 according to the output voltage of the power amplifier 210.

The SPDT switch 310 may electrically connect the common port 311 to the first port 313 when the output voltage does not exceed the threshold voltage. The output signal of the power amplifier 210 may be transmitted to the first switch 280 through the SPDT switch 310. The first switch 280 may include a first SPnT port 321-1 to an Nth SPnT port 321-N. The first switch 280 may switch to any one of the first SPnT port 321-1 to the N SPnT port 321-N, based on the output signal of the power amplifier 210.

The SPDT switch 310 may further include a control port (not shown). The control port of the SPDT switch 310 may be connected to the cathode of the first diode 220. The SPDT switch 310 may electrically connect the common port 311 to the first port 313 when the first diode 220 is turned off. The control port of the SPDT switch 310 may be configured to switch from the first port 313 to the second port 315 by electrically connecting the common port 311 to the second port 315 as the first diode 220 is turned on. The output signal of the power amplifier 210 may be transmitted to the terminating resistor 240 through the SPDT switch 310.

The first diode 220 may be branched from the first point 250 of the first electrical path 290 and connected between the first point 250 and the SPDT switch 310. The operating state of the first diode 220 may be a turn-off state when the output voltage of the power amplifier 210 is less than the voltage $V_d$ at which the first diode 220 is operable. The first diode 220 may be turned on when the output voltage of the power amplifier 210 is equal to or greater than the voltage $V_d$. As the first diode 220 is turned on, the SPDT switch 310 may electrically connect the power amplifier 210 with the terminating resistance 240, preventing damage to the power amplifier 210 due to overvoltage.

According to an embodiment of the disclosure, the RF circuit 200 may include a first resistor 260 connected between the first point 250 and the first diode 220. For example, as the resistance value of the first resistor 260 increases, the output voltage of the power amplifier 210 for turning on the first diode 220 may increase. The resistance value of the first resistor 260 may be determined so that the first diode 220 maintains the turn-off state when the output voltage of the power amplifier 210 does not exceed the threshold voltage. When the output voltage exceeds the threshold voltage, the first diode 220 may be turned on, and a control voltage may be applied to the SPDT switch 310. The control voltage of the SPDT switch 310 may vary depending on the resistance value of the first resistor 260. When the VSWR value is 10, the reflected wave of the output signal of the power amplifier 210 may be maximized. When the VSWR value is 10, the output of the power amplifier 210 may exceed about 32 dBm or about 1700 milliwatts (mW). When the VSWR value is 1, the output signal of the power amplifier 210 may be transmitted to the first switch 280 through the switching circuit 230 without reflection for the output signal of the power amplifier 210. When the VSWR value is 1, the output of the power amplifier 210 may have a value of about 27 dBm or about 506 mW. In an embodiment, the maximum value of the current flowing through the power amplifier 210 may be about 400 milliamps (mA). For example, when the VSWR value is 10, the maximum output voltage of the power amplifier 210 may be in the range of about 4 volts (V) to about 4.5 V. For example, when the VSWR value is 1, the maximum output voltage of the power amplifier 210 may be in the range of about 1 V to about 1.5 V. The output voltage of the power amplifier 210 may vary between about 1 and about 4.5 V, depending on the amplitude of the reflected wave for the output signal. In an embodiment, the resistance value of the first resistor 260 may be determined so that the SPDT switch 310 is switched by the control voltage. For example, according to the set resistance value of the first resistor 260, the SPDT switch 310 may be switched by a control voltage of about 3V. The SPDT switch 310 may be configured to switch from the first port 313 to the second port 315 by electrically connecting the common port 311 to the second port 315. The output signal of the power amplifier 210 may be transmitted to the terminating resistor 240 through the SPDT switch 310. The RF circuit 200 may prevent damage to the power amplifier 210 due to overvoltage based on the switching of the SPDT switch 310.

According to an embodiment of the disclosure, the first diode 220 and the SPDT switch 310 may be connected to ground by a first capacitor 270. The first capacitor 270 may bypass the alternating current (AC) signal output by the power amplifier 210 when the first diode 220 is turned on. The SPDT switch 310 may receive a direct current (DC) signal output by the power amplifier 210 according to the operation of the first capacitor 270.

In an embodiment, the SPDT switch 310 may perform a switching operation when the output voltage of the power amplifier 210 exceeds the threshold voltage without a control signal from a communication processor (not shown). In an embodiment, the communication processor may determine an antenna of a specific frequency band based on the switching of the first switch 280. In an embodiment, the communication processor may transmit a control signal to the first switch 280 through the transceiver. In an embodiment, the SPDT switch 310 may switch according to the magnitude of the output voltage of the power amplifier 210, regardless of the control signal of the communication processor. In an embodiment, the SPDT switch 310 may electrically connect the power amplifier 210 to the terminating resistance 240 by switching without delay when exceeding the output voltage of the power amplifier 210.

Figure 4:
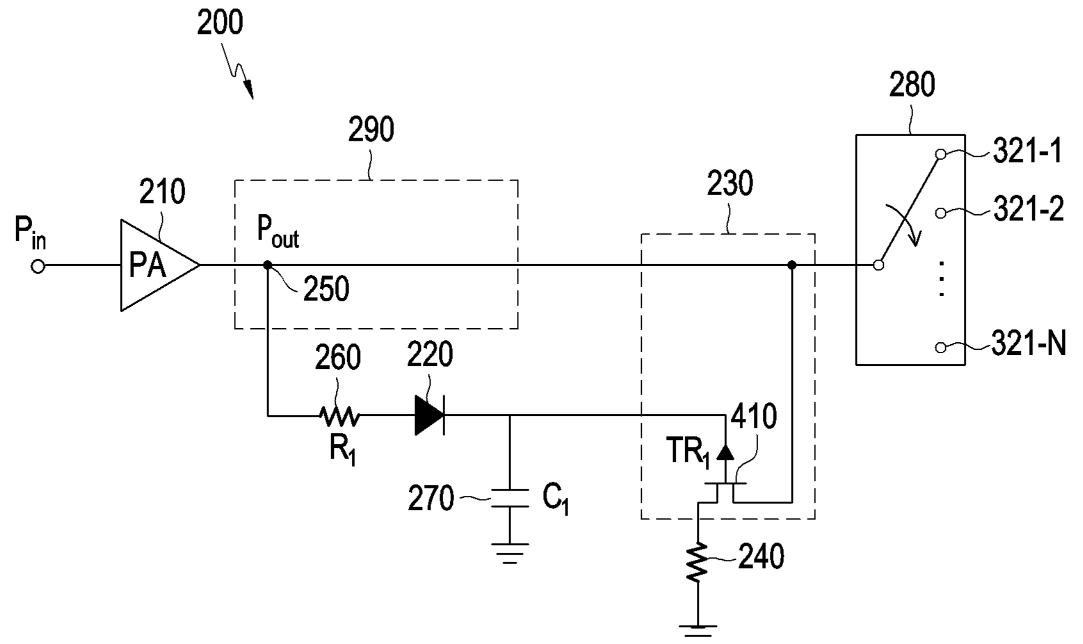
FIG. 4 is a view illustrating an RF circuit including a switching circuit implemented with transistors, according to an embodiment of the disclosure.

FIG. 4 is a view illustrating an RF circuit 200 including a switching circuit 230 implemented with transistors, according to an embodiment of the disclosure. Transistor 410 may form a short or open circuit between the output of the power amplifier 210 and the terminating resistance 240, when properly biased (turned on).

According to an embodiment, the RF circuit 200, when the output of the power amplifier 210 exceeds the threshold voltage by the reflected wave, may prevent damage the power amplifier 210 based on the operation of the first transistor 410.

Referring to FIG. 4, according to an embodiment of the disclosure, the RF circuit 200 may include a power amplifier 210, a first transistor (Ti) 410, and a first diode 220.

In an embodiment, the power amplifier 210 may amplify an input signal based on a set gain. In an embodiment, the output signal amplified by the power amplifier 210 may be transmitted to the terminating resistor 240 or the first switch 280 through the first electrical path 290 based on the operation of the first transistor 410.

In an embodiment, the switching circuit 230 (e.g., the switching circuit 230 of FIG. 2) may include the first transistor 410 configured to operate when the output voltage of the power amplifier 210 exceeds a set voltage. In an embodiment, the first transistor 410 may be turned on (form a short) or turned off (form an open circuit) according to the output voltage of the power amplifier 210.

When the output voltage does not exceed the threshold voltage, the first transistor 410 may be turned off. The output signal of the power amplifier 210 may be transmitted to the first switch 280 through the first electrical path.

The first transistor 410 may electrically connect the power amplifier 210 to the terminating resistance 240 as the first diode 220 is turned on. The output signal of the power amplifier 210 may be transmitted to the terminating resistance 240 through the first transistor 410.

The first diode 220 may be branched from the first point 250 of the first electrical path 290 and connected between the first point 250 and the first transistor 410. The operating state of the first diode 220 may be a turn-off state when the output voltage of the power amplifier 210 is less than the voltage at which the first diode 220 is operable. The first diode 220 may be turned on when the output voltage of the power amplifier 210 is equal to or greater than the voltage at which the first diode 220 is operable. In an embodiment, as the first diode 220 is turned on, the first transistor 410 may connect the power amplifier 210 with the terminating resistance 240, preventing damage to the power amplifier 210 due to overvoltage.

According to an embodiment of the disclosure, the RF circuit 200 may be configured to further include a first resistor 260 connected between the first point 250 and the first diode 220. For example, as the resistance value of the first resistor 260 increases, the output voltage of the power amplifier 210 for turning on the first diode 220 may increase. The resistance value of the first resistor 260 may be determined so that the first diode 220 maintains the turn-off state when the output voltage of the power amplifier 210 is does not exceed to the threshold voltage. The turn-on voltage of the first transistor 410 may vary depending on the resistance value of the first resistor 260. The first transistor 410 may be turned on when the output voltage of the power amplifier 210 exceeds the threshold voltage. The first transistor 410 may electrically connect the power amplifier 210 to the terminating resistance 240 through a path branched from the first electrical path 290. The output signal of the power amplifier 210 may be transmitted to the terminating resistance 240 through the first transistor 410. Accordingly, the RF circuit 200 may prevent damage to the power amplifier 210 due to overvoltage based on the operation of the first transistor 410.

According to an embodiment of the disclosure, the first diode 220 to the first transistor 410 connected to a first capacitor 270 that is grounded. The first capacitor 270 may bypass the alternating current (AC) signal output by the power amplifier 210 when the first diode 220 is turned on. The first transistor 410 may receive a direct current (DC) signal output by the power amplifier 210 according to the operation of the first capacitor 270.

Figure 5:
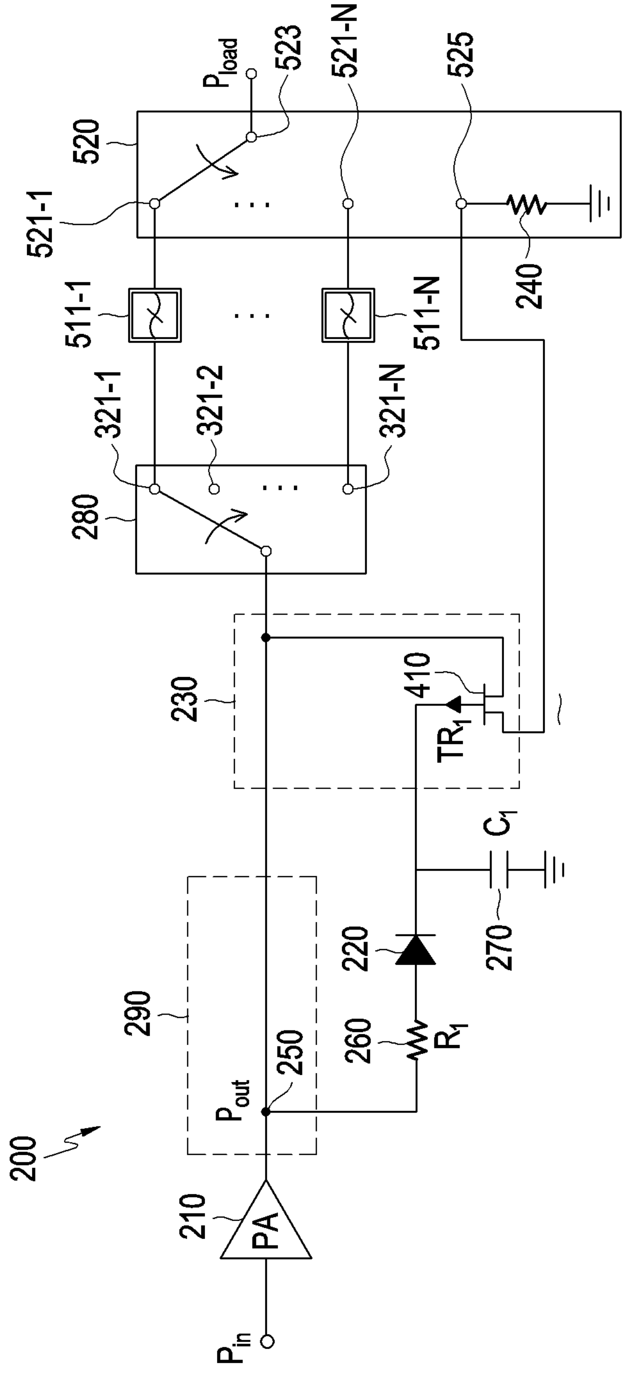
FIG. 5 is a view illustrating an RF circuit including a switching circuit connected to a terminating resistor inside an antenna switch module, according to an embodiment of the disclosure.

FIG. 5 is a view illustrating an RF circuit 200 including a switching circuit 230 connected to a terminating resistor 240 inside an antenna switch module 520, according to an embodiment of the disclosure.

The first switch 280 may include ports 321-1 . . . 321-N, that are connected to respective filters 511-1 . . . 511-N. Switches may select one of the ports 321-1 . . . 321-N based on the filter, and connect the power amplifier 210 through the selected filter 511-1 . . . 511-N to the antenna load $P_{LOAD}$.

According to an embodiment, the RF circuit 200, when the output of the power amplifier 210 exceeds the threshold voltage by the reflected wave, may prevent damage the power amplifier 210 by electrically connecting the power amplifier 210 to the terminating resistor 240 inside the antenna switch module 520 through the first transistor 410.

Referring to FIG. 5, according to an embodiment of the disclosure, the RF circuit 200 may include a power amplifier 210, a first transistor 410, and a first diode 220.

The power amplifier 210 may amplify an input signal based on a set gain. The output signal amplified by the power amplifier 210 may be transmitted to the terminating resistor 240 or the first switch 280 through the first electrical path 290 based on the operation of the first transistor 410.

The switching circuit 230 (e.g., the switching circuit 230 of FIG. 2) may include the first transistor 410, wherein the first transistor 410 is configured to operate when the output voltage of the power amplifier 210 exceeds a set voltage. In an embodiment, the first transistor 410 may be turned on or turned off according to the output voltage of the power amplifier 210.

When the output voltage does not exceed the threshold voltage, the first transistor 410 may be turned off. The output signal of the power amplifier 210 may be transmitted to the first switch 280 through the first electrical path. The first switch 280 may include a first SPnT port 321-1 to an Nth SPnT port 321-N. The first switch 280 may switch to any one of the first SPnT port 321-1 to the N SPnT port 321-N, based on the output signal of the power amplifier 210. When the first switch 280 switches to the first SPnT port 321-1, the output signal of the power amplifier 210 may be transmitted through the first transmission filter 511-1 to the antenna switch module 520. When the first switch 280 switches to the Nth SPnT port 321-N, the output signal of the power amplifier 210 may be transmitted through the Nth transmission filter 511-N to the antenna switch module 520. The antenna switch module 520 may be implemented as a multi-on switch supporting a plurality of RF bands. The method in which the antenna switch module 520 is implemented is not limited to that shown in FIG. 5. In an embodiment, when transmitting/receiving an RF signal of a specific frequency band, the antenna switch module 520 may perform a switching operation by connecting any one of the first antenna port 521-1 to the Nth antenna port 521-N to the common antenna port 523. In an embodiment, the antenna switch module 520 connects the termination port 525 with the common port 523 when not operating according to the determined logic, thereby preventing unwanted reflection of the RF signal. In an embodiment, the case of not operating according to the determined logic may include a case where the antenna switch module 520 does not transmit/receive an RF signal of a specific frequency band. When the antenna switch module 520 switches to the termination port 525, the signal received from an antenna (not shown) may be transmitted to the terminating resistance 240 inside the antenna switch module 520.

The first transistor 410 may electrically connect the power amplifier 210 to the terminating resistance 240 inside the antenna switch module 520 as the first diode 220 is turned on. The output signal of the power amplifier 210 may be transmitted to the terminating resistance 240 through the first transistor 410.

The first diode 220 may be branched from the first point 250 of the first electrical path 290 and connected between the first point 250 and the first transistor 410. In an embodiment, the operating state of the first diode 220 may be a turn-off state when the output voltage of the power amplifier 210 is less than the voltage at which the first diode 220 is operable. The first diode 220 may be turned on when the output voltage of the power amplifier 210 is equal to or greater than the voltage at which the first diode 220 is operable. As the first diode 220 is turned on, the first transistor 410 may electrically connect the power amplifier 210 with the terminating resistance 240, preventing damage to the power amplifier 210 due to overvoltage.

According to an embodiment of the disclosure, the RF circuit 200 may include a first resistor 260 connected between the first point 250 and the first diode 220. For example, as the resistance value of the first resistor 260 increases, the output voltage of the power amplifier 210 for turning on the first diode 220 may increase. The resistance value of the first resistor 260 may be determined so that the first diode 220 maintains the turn-off state when the output voltage of the power amplifier 210 does not exceed the threshold voltage. The turn-on voltage of the first transistor 410 may vary depending on the resistance value of the first resistor 260. The first transistor 410 may be turned on when the output voltage of the power amplifier 210 exceeds the threshold voltage. The first transistor 410 may electrically connect the power amplifier 210 to the terminating resistance 240 inside the antenna switch module 520 through a path branched from the first electrical path 290. The output signal of the power amplifier 210 may be transmitted to the terminating resistance 240 inside the antenna switch module 520 through the first transistor 410. Accordingly, the RF circuit 200 may prevent damage to the power amplifier 210 due to overvoltage based on the operation of the first transistor 410. The RF circuit 200 may prevent damage to the power amplifier 210 due to overvoltage by using the terminating resistance 240 inside the antenna switch module 520 without an additional resistance element.

According to an embodiment of the disclosure, the RF circuit 200 may be branched from an electrical path connecting the first diode 220 to the first transistor 410 and further include a first capacitor 270 connected between the first diode 220 and the ground. The first capacitor 270 may bypass the alternating current (AC) signal output by the power amplifier 210 when the first diode 220 is turned on. The first transistor 410 may receive a direct current (DC) signal output by the power amplifier 210 according to the operation of the first capacitor 270.

Figure 6:
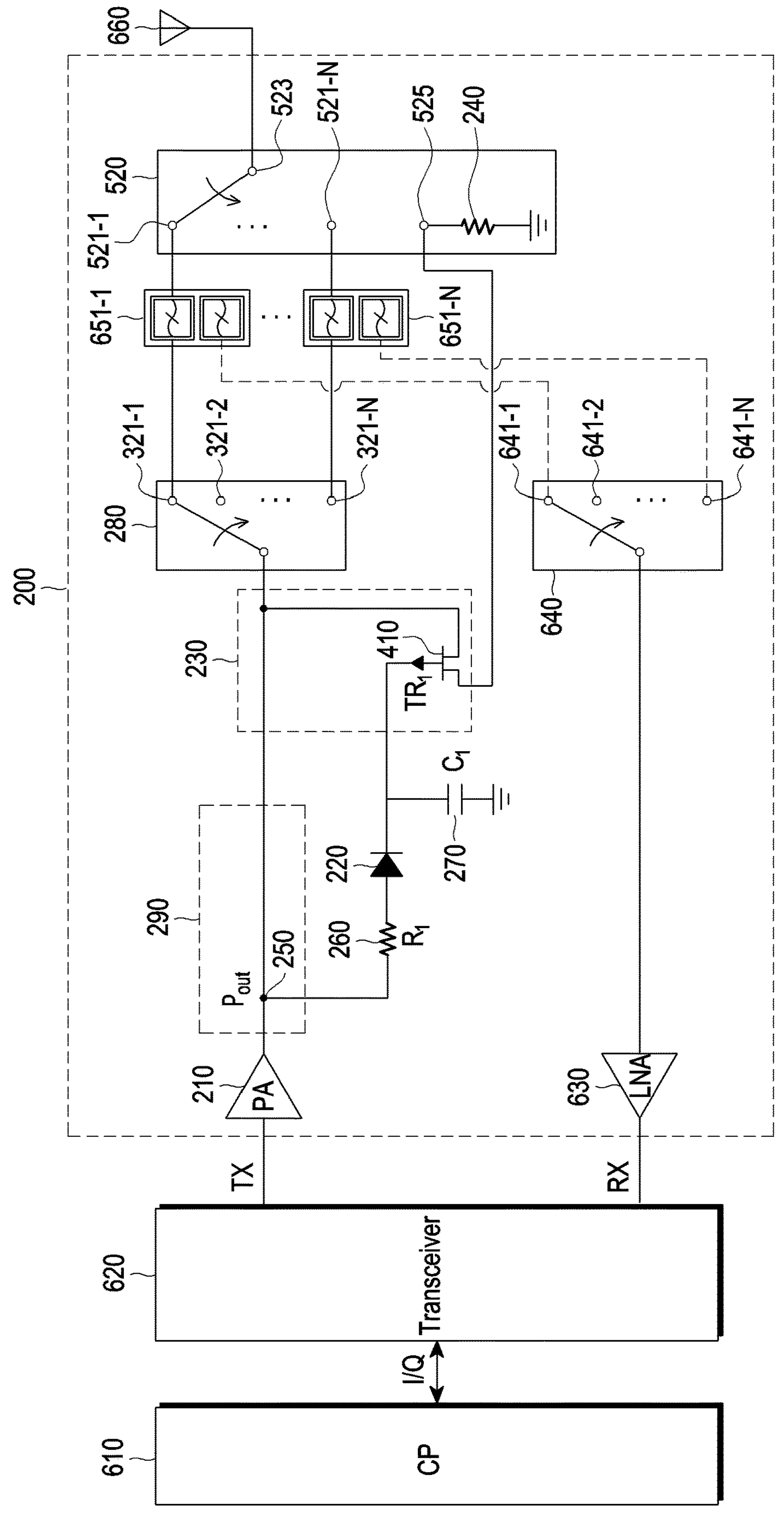
FIG. 6 is a view illustrating an electronic device including an RF circuit according to an embodiment of the disclosure.

FIG. 6 is a view illustrating an electronic device (e.g., the electronic device 101 of FIG. 1) including an RF circuit 200 according to an embodiment of the disclosure.

FIG. 6 shows the receiver in the front end circuit. The receiver can similarly form an electrical path between the antenna 660, a selected one of the duplexers 651-1 . . . 651-N, and a Low-Noise Amplifier (LNA) 630.

According to an embodiment, the electronic device 101, when the output of the power amplifier 210 exceeds the threshold voltage, may prevent damage to the power amplifier 210 based on the operation of the RF circuit 200. The specific operation of the RF circuit 200 has been described with reference to FIG. 5, and redundant description will be omitted.

In an embodiment, a communication processor (CP) 610 may transmit a complex (I/Q according to phase modulation) signal to the transceiver 620 to radiate a transmission signal to the outside. The transceiver 620 may convert the frequency of the received complex signal and transmit a control signal to the power amplifier 210. The power amplifier 210 may amplify the RF signal received from the transceiver 620. Although one power amplifier 210 is shown in FIG. 6, in an embodiment, the RF circuit 200 may include a plurality of power amplifiers 210 for each frequency band. The RF circuit 200 may be configured to transmit the RF signal obtained from the transceiver 620 to the antenna switch module 520 through the first switch 280 when the output voltage of the power amplifier 210 is equal to or less than the threshold voltage. The RF signal amplified by the power amplifier 210 may be transmitted to the antenna 660 through the first switch 280 and the antenna switch module 520 when the first transistor 410 is turned off. The RF signal amplified by the power amplifier 210 may be transmitted through any one of the first duplexer 651-1 to the Nth duplexer 651-N to the antenna switch module 520. As the antenna 660 radiates the transmission signal to the outside based on the signal output by any one of the first duplexer 651-1 to the Nth duplexer 651-N, the antenna 660 may perform a signal transmission operation.

When the output voltage of the power amplifier 210 exceeds the threshold voltage, the first transistor 410 may be turned on. When the first transistor 410 is in a turn-on state, the RF signal amplified by the power amplifier 210 may be transmitted through the first transistor 410 to the terminating resistance 240 inside the antenna switch module 520. According to an embodiment, the RF circuit 200, when the output of the power amplifier 210 exceeds the threshold voltage, may prevent damage the power amplifier 210 based on the operation of the first transistor 410.

The antenna 660 may perform a signal receiving operation by receiving an RF signal based on detecting an external electric field. In an embodiment, the RF signal received by the antenna 660 may be transmitted to the low-noise amplifier 630 (LNA) through the antenna switch module 520 and the second switch 640. In an embodiment, the RF signal received by the antenna 660 may be transmitted to the low-noise amplifier 630 through any one of the first duplexer 651-1 to the Nth duplexer 651-N connected between the antenna switch module 520 and the second switch 640. The low-noise amplifier 630 may amplify the signal output by any one of the first duplexer 651-1 to the Nth duplexer 651-N. The signal amplified by the low-noise amplifier 630 may be transmitted to the communication processor 610 through the transceiver 620.

Figure 7:
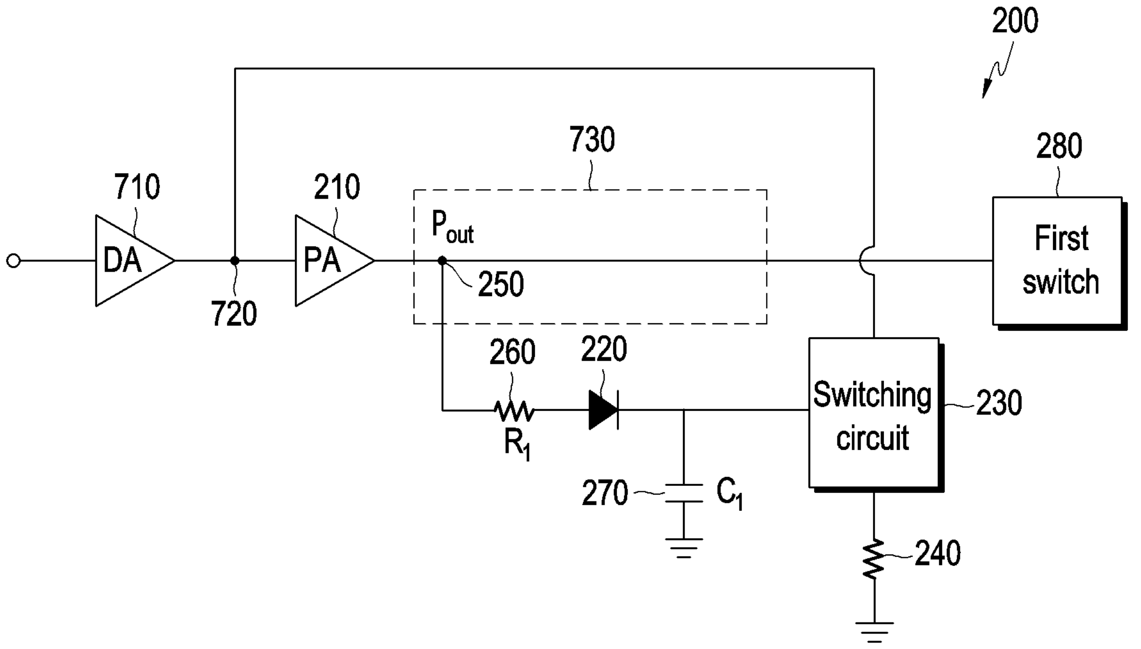
FIG. 7 is a view illustrating an RF circuit including a switching circuit according to an embodiment of the disclosure.

FIG. 7 is a view illustrating an RF circuit 200 including a switching circuit 230 according to an embodiment of the disclosure. In FIG. 7, a driving amplifier (DA) 710 is connected to the input of the power amplifier 210. Damage to the power amplifier 210 is avoided by selectively connecting the output of a driving amplifier (DA) 710 to the terminating resistance 240.

According to an embodiment, the RF circuit 200, when the output voltage of the power amplifier 210 exceeds the threshold voltage, may prevent damage the power amplifier 210 based on the operation of the switching circuit 230. In an embodiment, the switching circuit 230, when the output voltage of the power amplifier 210 exceeds the threshold voltage, may be configured to electrically connect a driving amplifier (DA, or device amplifier) 710 electrically connected to the input end of the power amplifier 210 to the terminating resistance 240.

Referring to FIG. 7, according to an embodiment of the disclosure, the RF circuit 200 may include a power amplifier 210, a switching circuit 230, and a first diode 220.

In an embodiment, the power amplifier 210 may amplify an input signal based on a set gain. The input signal of the power amplifier 210 may be the output signal of the driving amplifier 710. The maximum output of power amplifier 210 may be about 30 dBm or more. In an embodiment, the driving amplifier 710 and the power amplifier 210 may sequentially amplify signals output by the transceiver (e.g., the transceiver 620 of FIG. 6). FIG. 7 illustrates one driving amplifier 710 and one power amplifier 210. However, the electronic device (e.g., the electronic device 101 of FIG. 1) may include a plurality of driving amplifiers and power amplifiers connected in series. The output signal amplified by the power amplifier 210 may be transmitted to the first switch 280 through an electrical path 730. The output signal of power amplifier 210 may be an RF signal.

The switching circuit 230 may be turned off when the output voltage of the power amplifier 210 does not exceed the threshold voltage. The signal output from the power amplifier 210 may be transmitted through a electrical path formed between the power amplifier 210 and the first switch 280.

The switching circuit 230, when the output voltage of the power amplifier 210 exceeds the threshold voltage, may electrically connect the driving amplifier 710 electrically connected to the input end of the power amplifier 210 to the terminating resistance 240. The switching circuit 230 may be branched at the second point 720 of the electrical path between the driving amplifier 710 and the power amplifier 210 and be connected between the second point 720 and the terminating resistance 240. The switching circuit 230 may electrically connect the driving amplifier 710 to the ground (GND) through the terminating resistance 240 when the output voltage of the power amplifier 210 exceeds the threshold voltage. As the switching circuit 230 electrically connects the driving amplifier 710 to the ground, damage to the power amplifier 210 from overvoltage may be prevented.

The first diode 220 may be branched from the first point 250 of the electrical path 730 and connected between the first point 250 and the switching circuit 230. The operating state of the first diode 220 may be a turn-off state when the output voltage of the power amplifier 210 is less than the voltage at which the first diode 220 is operable. The first diode 220 may be turned on when the output voltage of the power amplifier 210 is equal to or greater than the voltage at which the first diode 220 is operable. As the first diode 220 is turned on, the switching circuit 230 may connect the driving amplifier 710 with the terminating resistance 240, preventing damage to the power amplifier 210 due to overvoltage.

According to an embodiment of the disclosure, the RF circuit 200 may include a first resistor 260 connected between the first point 250 and the first diode 220. The resistance value of the first resistor 260 may be determined based on a maximum output voltage at which the power amplifier 210 may normally operate. For example, as the resistance value of the first resistor 260 increases, the output voltage of the power amplifier 210 for turning on the first diode 220 may increase.

According to an embodiment of the disclosure, the RF circuit 200 may be branched from an electrical path connecting the first diode 220 to the switching circuit 230 and include a first capacitor 270 connected between the first diode 220 and the ground. The first capacitor 270 may bypass the alternating current (AC) signal output by the power amplifier 210 when the first diode 220 is turned on. The switching circuit 230 may receive a direct current (DC) signal output by the power amplifier 210 according to the operation of the first capacitor 270.

Figure 8:
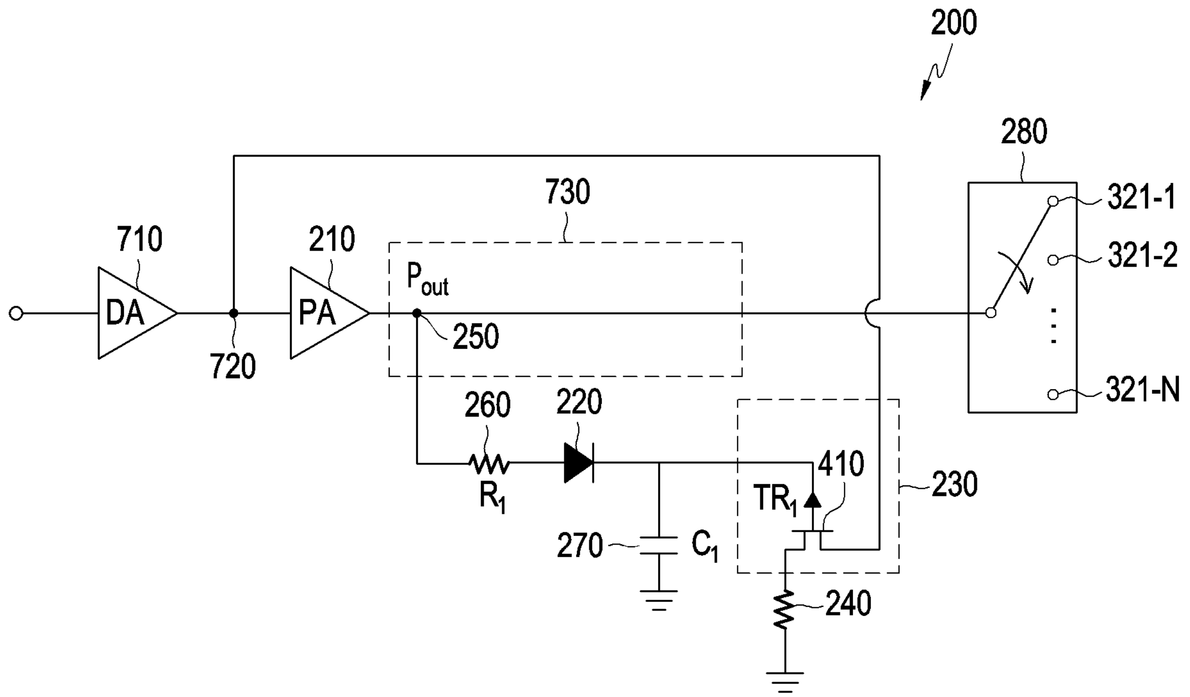
FIG. 8 is a view illustrating an RF circuit including a switching circuit implemented with transistors, according to an embodiment of the disclosure.

FIG. 8 is a view illustrating an RF circuit 200 including a switching circuit 230 implemented with transistors, according to an embodiment of the disclosure.

According to an embodiment, the RF circuit 200, when the output of the power amplifier 210 exceeds the threshold voltage, may prevent damage the power amplifier 210 based on the operation of the first transistor 410. The first transistor 410, when the output voltage of the power amplifier 210 exceeds the threshold voltage, may be configured to electrically connect a driving amplifier 710 electrically connected to the input end of the power amplifier 210 to the terminating resistance 240.

Referring to FIG. 8, according to an embodiment of the disclosure, the RF circuit 200 may include a power amplifier 210, a switching circuit 230, and a first diode 220.

The power amplifier 210 may amplify an input signal based on a set gain. The input signal of the power amplifier 210 may be the output signal of the driving amplifier 710. The output signal amplified by the power amplifier 210 may be transmitted to the first switch 280 through an electrical path 730. The output signal of power amplifier 210 may be an RF signal.

The first transistor 410 may be turned off when the output voltage of the power amplifier 210 is does not exceed to the threshold voltage. The signal output from the power amplifier 210 may be transmitted through an electrical path 730 formed between the power amplifier 210 and the first switch 280.

The first transistor 410, when the output voltage of the power amplifier 210 exceeds the threshold voltage, may electrically connect the driving amplifier 710 (that is electrically connected to the input end of the power amplifier 210) to the terminating resistance 240. The first transistor 410 may be branched at the second point 720 of the electrical path between the driving amplifier 710 and the power amplifier 210 and be connected between the second point 720 and the terminating resistance 240. The first transistor 410 may connect the driving amplifier 710 to the ground (GND) through the terminating resistance 240 when the output voltage of the power amplifier 210 exceeds the threshold voltage. As the first transistor 410 connects the driving amplifier 710 to the ground, it is possible to prevent damage to the power amplifier 210 due to overvoltage.

The first diode 220 may be branched from the first point 250 of the electrical path 730 and be connected between the first point 250 and the first transistor 410. The operating state of the first diode 220 may be a turn-off state when the output voltage of the power amplifier 210 is less than the voltage at which the first diode 220 is operable. The first diode 220 may be turned on when the output voltage of the power amplifier 210 is equal to or greater than the voltage at which the first diode 220 is operable. In an embodiment, as the first diode 220 is turned on, the first transistor 410 may connect the driving amplifier 710 with the terminating resistance 240, preventing damage to the power amplifier 210 due to overvoltage.

According to an embodiment of the disclosure, the RF circuit 200 may be configured to further include a first resistor 260 connected between the first point 250 and the first diode 220. The resistance value of the first resistor 260 may be determined based on a maximum output voltage at which the power amplifier 210 may normally operate. For example, as the resistance value of the first resistor 260 increases, the output voltage of the power amplifier 210 for turning on the first diode 220 may increase.

According to an embodiment of the disclosure, the RF circuit 200 may be configured to be branched from an electrical path connecting the first diode 220 to the first transistor 410 and further include a first capacitor 270 connected between the first diode 220 and the ground. The first capacitor 270 may bypass the alternating current (AC) signal output by the power amplifier 210 when the first diode 220 is turned on. The first transistor 410 may receive a direct current (DC) signal output by the power amplifier 210 according to the operation of the first capacitor 270.

Figure 9:
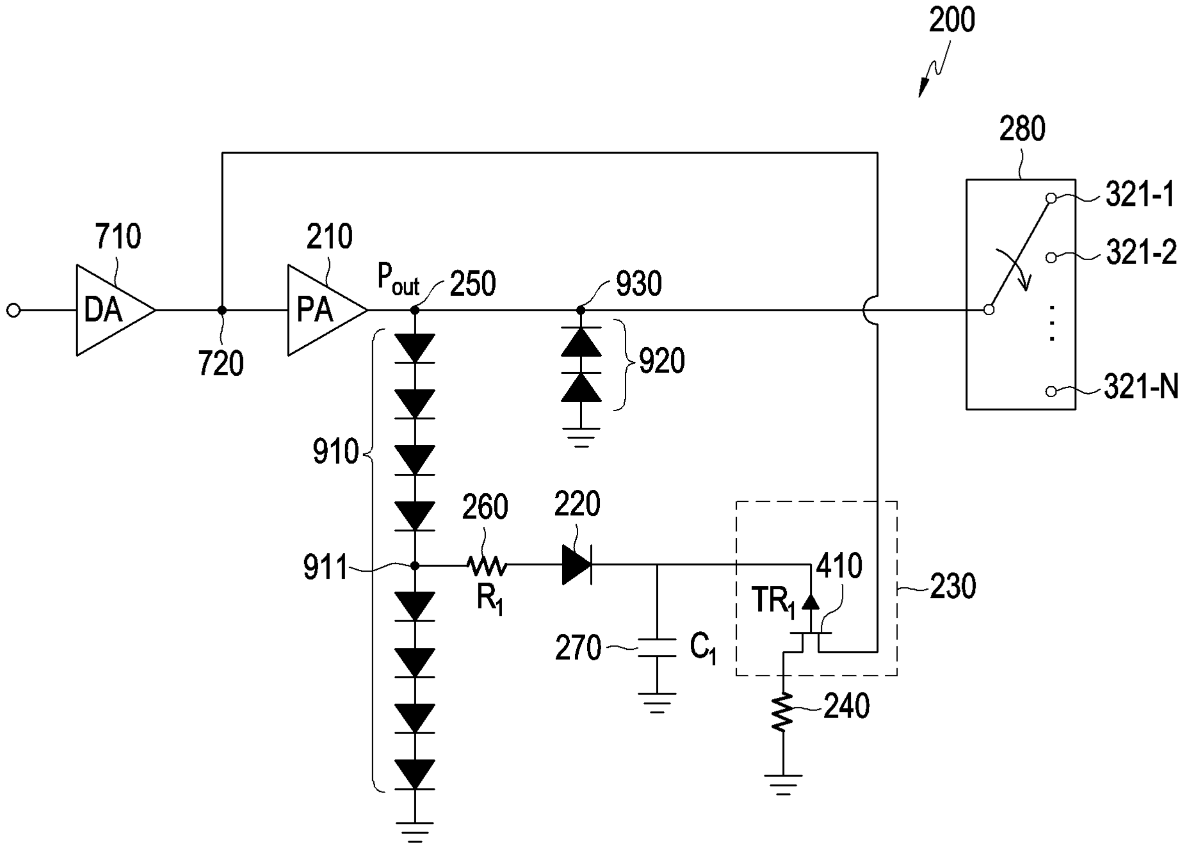
FIG. 9 is a view illustrating an RF circuit including a diode stack connected to a power amplifier, according to an embodiment of the disclosure.

FIG. 9 is a view illustrating an RF circuit 200 including a diode stack connected to a power amplifier 210, according to an embodiment of the disclosure.

According to an embodiment, the RF circuit 200, when the output of the power amplifier 210 exceeds the threshold voltage, may prevent damage the power amplifier 210 based on the operation of the first transistor 410. The first transistor 410, when the output voltage of the power amplifier 210 exceeds the threshold voltage, may be configured to electrically connect a driving amplifier 710 electrically connected to the input end of the power amplifier 210 to the terminating resistance 240. The turn-on voltage of the first transistor 410 may be determined by the first diode stack 910. Regarding the specific operation of the RF circuit 200, those described in connection with FIG. 8 are omitted from the description.

The RF circuit 200 may be configured to include a first diode stack 910 including a plurality of diodes. For example, the number of diodes included in the first diode stack 910 is not limited to that shown in FIG. 9. The first diode stack 910 may be branched from the first point 250 of the electrical path 730 and be connected between the first point 250 and the ground, and be configured so that the anode of one of the plurality of diodes is electrically connected to the power amplifier 210. The first diode stack 910 may be configured so that the cathode of any one of the plurality of diodes included in the first diode stack 910 is electrically connected to the anode of the first diode 220. The turn-on voltage of the first transistor 410 may be determined based on the determination of the branch point 911 of the first diode stack 910. The RF circuit 200 may be configured to further include a first resistor 260 connected between the cathode of any one of the plurality of diodes included in the first diode stack 910 and the first diode 220. The RF circuits shown in FIGS. 3 and 4 may be configured to include a first diode stack 910.

The RF circuit 200 may be configured to include a second diode stack 920 including a plurality of diodes. For example, the second diode stack 920 may be branched from the third point 930 of the electrical path 730 and be connected between the third point 930 and the ground, and be configured so that the cathode of one of the plurality of diodes included in the second diode stack 920 is electrically connected to the power amplifier 210. The second diode stack 920 may operate as a clipper circuit that limits the negative voltage output by the power amplifier 210.

Figure 10:
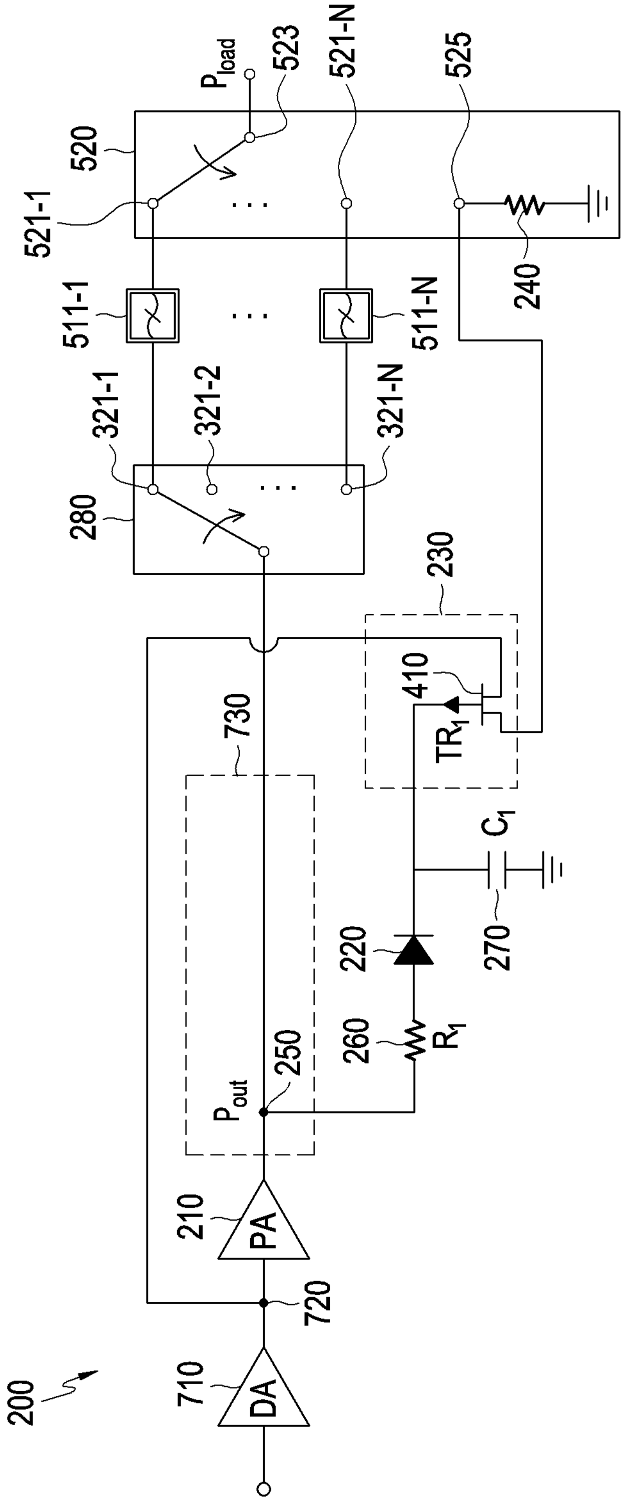
FIG. 10 is a view illustrating an RF circuit including a switching circuit connected to a terminating resistor inside an antenna switch module, according to an embodiment of the disclosure.

FIG. 10 is a view illustrating an RF circuit 200 including a switching circuit 230 connected to a terminating resistor 240 inside an antenna switch module 520, according to an embodiment of the disclosure.

According to an embodiment, the RF circuit 200, when the output voltage of the power amplifier 210 exceeds the threshold voltage, may prevent damage the power amplifier 210 by electrically connecting the driving amplifier 710 to the terminating resistor 240 inside the antenna switch module 520 through the first transistor 410.

Referring to FIG. 10, according to an embodiment of the disclosure, the RF circuit 200 may include a power amplifier 210, a first transistor 410, and a first diode 220.

The power amplifier 210 may amplify an input signal based on a set gain. The input signal of the power amplifier 210 may be the output signal of the driving amplifier 710. The output signal amplified by the power amplifier 210 may be transmitted to the first switch 280 through an electrical path 730. The output signal of power amplifier 210 may be an RF signal.

The switching circuit 230 (e.g., the switching circuit 230 of FIG. 2) may be configured to include the first transistor 410 configured to operate when the output voltage of the power amplifier 210 exceeds a set voltage. The first transistor 410 may be turned on or turned off according to the output voltage of the power amplifier 210.

The first transistor 410 may be turned off when the output voltage of the power amplifier 210 does not exceed the threshold voltage. The signal output from the power amplifier 210 may be transmitted through an electrical path formed between the power amplifier 210 and the first switch 280. The first switch 280 may include a first SPnT port 321-1 to an Nth SPnT port 321-N. The first switch 280 may switch to any one of the first SPnT port 321-1 to the N SPnT port 321-N, based on the output signal of the power amplifier 210. When the first switch 280 switches to the first SPnT port 321-1, the output signal of the power amplifier 210 may be transmitted through the first transmission filter 511-1 to the antenna switch module 520. When the first switch 280 switches to the Nth SPnT port 321-N, the output signal of the power amplifier 210 may be transmitted through the Nth transmission filter 511-N to the antenna switch module 520. In an embodiment, when transmitting an RF signal of a specific frequency band, the antenna switch module 520 may perform a switching operation by connecting any one of the first antenna port 521-1 to the Nth antenna port 521-N to the common antenna port 523. The antenna switch module 520 connects the termination port 525 with the common port 523 when not operating according to the determined logic, thereby preventing unwanted reflection of the RF signal. The case of not operating according to the determined logic may include a case where the antenna switch module 520 does not transmit/receive an RF signal of a specific frequency band. When the antenna switch module 520 switches to the termination port 525, the signal received from an antenna (e.g., the antenna 660 of FIG. 6) may be transmitted to the terminating resistance 240 inside the antenna switch module 520.

The first transistor 410 may electrically connect the driving amplifier 710 electrically connected to the input end of the power amplifier 210 to the terminating resistance 240 inside the antenna switch module 520 as the first diode 220 is turned on. The first transistor 410 may be branched at the second point 720 of the electrical path between the driving amplifier 710 and the power amplifier 210 and be connected between the second point 720 and the terminating resistance 240. The first transistor 410 may connect the driving amplifier 710 to the ground (GND) through the terminating resistance 240 when the output voltage of the power amplifier 210 exceeds the threshold voltage. The input signal of the power amplifier 210 may be transmitted to the terminating resistance 240 inside the antenna switch module 520 through the first transistor 410. As the first transistor 410 connects the driving amplifier 710 to the ground, it is possible to prevent damage to the power amplifier 210 due to overvoltage.

The first diode 220 may be branched from the first point 250 of the electrical path 730 and be connected between the first point 250 and the first transistor 410. The operating state of the first diode 220 may be a turn-off state when the output voltage of the power amplifier 210 is less than the voltage at which the first diode 220 is operable. The first diode 220 may be turned on when the output voltage of the power amplifier 210 is equal to or greater than the voltage at which the first diode 220 is operable. In an embodiment, as the first diode 220 is turned on, the first transistor 410 may electrically connect the driving amplifier 710 with the terminating resistance 240, preventing damage to the power amplifier 210 due to overvoltage.

According to an embodiment of the disclosure, the RF circuit 200 may include a first resistor 260 connected between the first point 250 and the first diode 220. For example, as the resistance value of the first resistor 260 increases, the output voltage of the power amplifier 210 for turning on the first diode 220 may increase. The resistance value of the first resistor 260 may be determined so that the first diode 220 maintains the turn-off state when the output voltage of the power amplifier 210 is does not exceed to the threshold voltage. The turn-on voltage of the first transistor 410 may vary depending on the resistance value of the first resistor 260. The first transistor 410 may be turned on when the output voltage of the power amplifier 210 exceeds the threshold voltage. The first transistor 410 may electrically connect the driving amplifier 710 to the terminating resistance 240 inside the antenna switch module 520. The input signal of the power amplifier 210 may be transmitted to the terminating resistance 240 inside the antenna switch module 520 through the first transistor 410. The RF circuit 200 may prevent damage to the power amplifier 210 due to overvoltage based on the operation of the first transistor 410. The RF circuit 200 may prevent damage to the power amplifier 210 due to overvoltage by using the terminating resistance 240 inside the antenna switch module 520 without an additional resistance element.

According to an embodiment of the disclosure, the RF circuit 200 may be configured to be branched from an electrical path connecting the first diode 220 to the first transistor 410 and further include a first capacitor 270 connected between the first diode 220 and the ground. The first capacitor 270 may bypass the alternating current (AC) signal output by the power amplifier 210 when the first diode 220 is turned on. The first transistor 410 may receive a direct current (DC) signal output by the power amplifier 210 according to the operation of the first capacitor 270.

Figure 11:
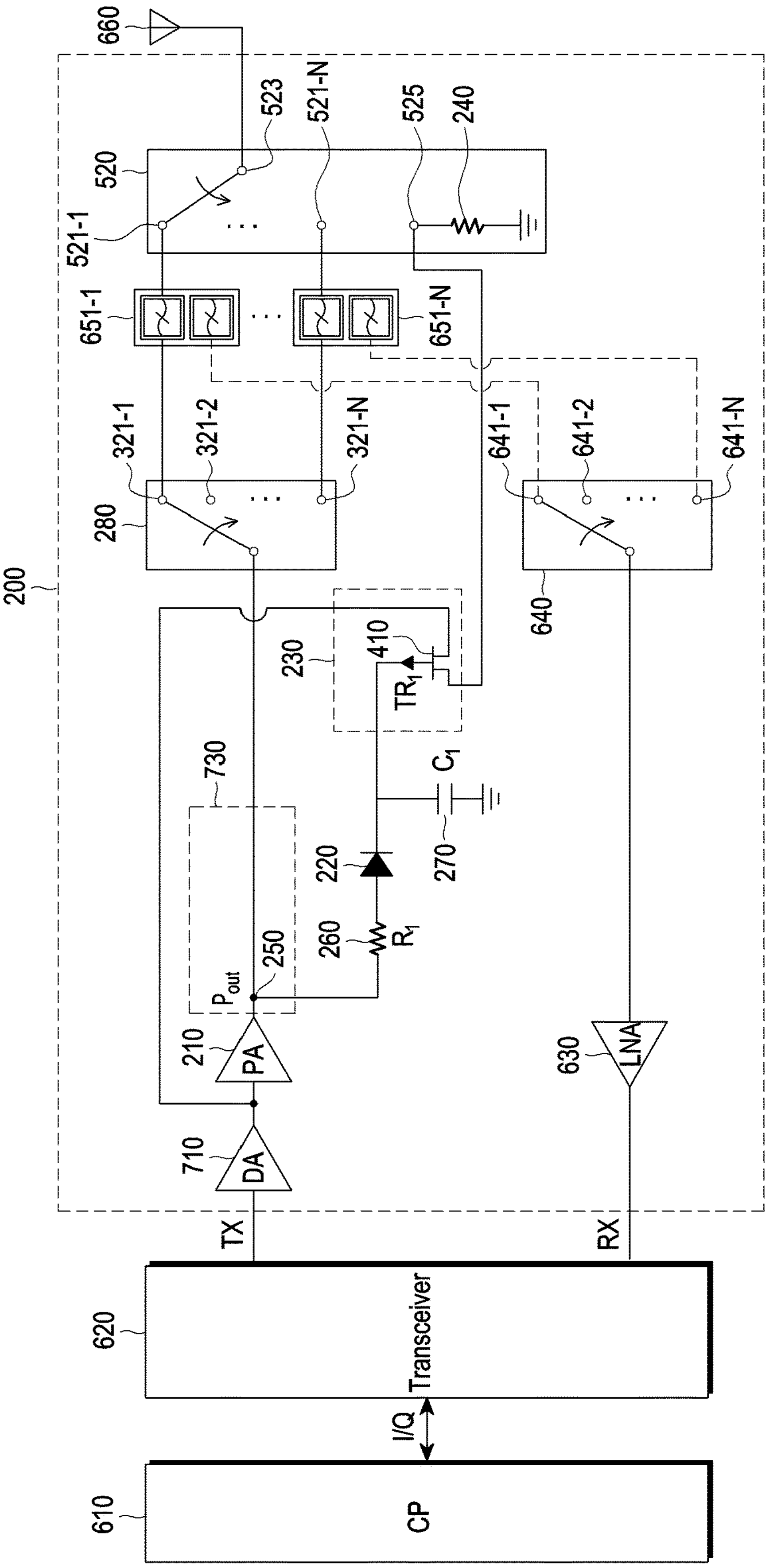
FIG. 11 is a view illustrating an electronic device including an RF circuit according to an embodiment of the disclosure.

FIG. 11 is a view illustrating an electronic device (e.g., the electronic device 101 of FIG. 1) including an RF circuit 200 according to an embodiment of the disclosure.

According to an embodiment, the electronic device 101, when the output of the power amplifier 210 exceeds the threshold voltage, may prevent damage the power amplifier 210 based on the operation of the RF circuit 200. The specific operation of the RF circuit 200 has been described with reference to FIG. 10, and redundant description will be omitted.

In an embodiment, a communication processor 610 may transmit a complex signal to the transceiver 620 to radiate a transmission signal to the outside. The transceiver 620 may convert the frequency of the received complex signal and transmit a control signal to the driving amplifier 710. The driving amplifier 710 and the power amplifier 210 may sequentially amplify the RF signal received from the transceiver 620. FIG. 11 illustrates one driving amplifier 710 and one power amplifier 210. However, The RF circuit 200 may include a plurality of driving amplifiers and power amplifiers. The RF circuit 200 may be configured to transmit the RF signal obtained from the transceiver 620 to the antenna switch module 520 through the first switch 280 when the output voltage of the power amplifier 210 is equal to or less than the threshold voltage. The RF signal amplified by the power amplifier 210 may be transmitted to the antenna 660 through the first switch 280 and the antenna switch module 520 when the first transistor 410 is turned off. The RF signal amplified by the power amplifier 210 may be transmitted through any one of the first duplexer 651-1 to the Nth duplexer 651-N to the antenna switch module 520. As the antenna 660 radiates the transmission signal to the outside based on the signal output by any one of the first duplexer 651-1 to the Nth duplexer 651-N, the antenna 660 may perform a signal transmission operation.

In an embodiment, when the output voltage of the power amplifier 210 exceeds the threshold voltage, the first transistor 410 may be turned on. When the first transistor 410 is in a turn-on state, the input signal of the power amplifier 210 may be transmitted through the first transistor 410 to the terminating resistance 240 inside the antenna switch module 520. According to an embodiment, the RF circuit 200, when the output of the power amplifier 210 exceeds the threshold voltage, may prevent damage the power amplifier 210 based on the operation of the first transistor 410.

The antenna 660 may perform a signal receiving operation by receiving an RF signal based on detecting an external electric field. The RF signal received by the antenna 660 may be transmitted to the low-noise amplifier 630 through the antenna switch module 520 and the second switch 640. The RF signal generated by the antenna 660 may be transmitted to the low-noise amplifier 630 through any one of the first duplexer 651-1 to the Nth duplexer 651-N connected between the antenna switch module 520 and the second switch 640. For example, the low-noise amplifier 630 may amplify the signal output by any one of the first duplexer 651-1 to the Nth duplexer 651-N. The signal amplified by the low-noise amplifier 630 may be transmitted to the communication processor 610 through the transceiver 620.

According to an embodiment of the disclosure, an RF circuit 200 may comprise a power amplifier 210, a switching circuit 230 configured to electrically connect the power amplifier 210 to a first switch 280 in case that an output voltage of the power amplifier 210 is a threshold voltage or less and to electrically connect the power amplifier 210 to a terminating resistor 240 in case that the output voltage of the power amplifier 210 exceeds the threshold voltage, a first electrical path 290 formed between the power amplifier 210 and the switching circuit 230, and a first diode 220 connected to a second electrical path formed from a first point 250 to the switching circuit 230, the first diode connected between the first point and the switching circuit.

According to an embodiment, the RF circuit 200 may further comprise a first resistor 260 connected between the first point 250 and the first diode 220.

According to an embodiment, the switching circuit 230 may include a SPDT switch 310 including a common port 311, a first port 313, and a second port 315.

According to an embodiment, the common port 311 may be connected to the power amplifier 210 through the first electrical path 290. The first port 313 may be connected to the first switch 280. The second port 315 may be connected to the terminating resistor 240.

According to an embodiment, the SPDT switch 310 may be configured to electrically connect the common port 311 to the first port 313 in case that the output voltage does not exceed the threshold voltage or less. The SPDT switch 310 may be configured to switch from the first port 313 to the second port 315, by electrically connecting the common port 311 to the second port 315, in case that the output voltage exceeds the threshold voltage.

According to an embodiment, the switching circuit 230 may include a first transistor 410 configured to operate in case that the output voltage of the power amplifier 210 exceeds a preset voltage.

According to an embodiment, the first transistor 410 may be configured to electrically connect the power amplifier 210 to the terminating resistor 240 through a path branched from the first electrical path 290 to the terminating resistor in case that the output voltage of the power amplifier 210 exceeds the threshold voltage.

According to an embodiment, the switching circuit 230 may be configured to connect the power amplifier 210 to a terminating resistor 240 inside an antenna switch module 520 in case that the output voltage of the power amplifier 210 exceeds the threshold voltage.

According to an embodiment, the RF circuit 200 may be configured to transmit a control signal received from a transceiver 620 to an antenna switch module 520 through the first switch 280 in case that the output voltage of the power amplifier 210 is the threshold voltage or less.

According to an embodiment, the RF circuit 200 may further comprise a first capacitor 270 connecting the first diode 220 and the switching circuit 230 to a ground.

According to an embodiment of the disclosure, an RF circuit 200 may comprise a power amplifier 210, a switching circuit 230 configured to electrically connect a driving amplifier 710 to a terminating resistor 240 in case that an output voltage of the power amplifier 210 exceeds a threshold voltage, wherein the driving amplifier 710 is electrically connected to an input end of the power amplifier 210, a first switch 280 configured to receive an output signal of the power amplifier 210, an electrical path 730 formed between the power amplifier 210 and the first switch 280, and a first diode 220 connected to a second electrical path formed from a first point (250) of the first electrical path (730) to the switching circuit (230), and connected between the first point 250 and the switching circuit 230.

According to an embodiment, the RF circuit 200 may further comprise a first diode stack 910 including a plurality of diodes, connecting the first point 250 of the first electrical path 730 to ground, wherein an anode of a diode among the plurality of diodes is electrically connected to the power amplifier 210.

According to an embodiment, a cathode of another diode among the plurality of diodes included in the first diode stack 910 is electrically connected to an anode of the first diode 220.

According to an embodiment, the RF circuit 200 may further comprise a second diode stack 920 including a second plurality of diodes, connecting the first point 250 of the first electrical path 730 to ground, a cathode of a diode among the second plurality of diodes is electrically connected to the power amplifier 210.

According to an embodiment, the RF circuit 200 may further comprise a first resistor 260 connected between the first point 250 and the first diode 220.

According to an embodiment, the switching circuit 230 may include a first transistor 410 configured to operate in case that the output voltage of the power amplifier 210 exceeds a preset voltage.

According to an embodiment, the first transistor 410 may be configured to electrically connect the driving amplifier 710 to the terminating resistor 240 in case that the output voltage of the power amplifier 210 exceeds the threshold voltage.

According to an embodiment, the switching circuit 230 may be configured to connect the driving amplifier 710 to a terminating resistor inside an antenna switch module 520 in case that the output voltage of the power amplifier 210 exceeds the threshold voltage.

According to an embodiment, the RF circuit 200 may be configured to transmit a control signal received from a transceiver 620 to an antenna switch module 520 through the first switch 280 in case that the output voltage of the power amplifier 210 does not exceed the threshold voltage.

According to an embodiment, the RF circuit 200 may further comprise a first capacitor 270 connecting the first diode 220 to the switching circuit 230 to ground.

The electronic device according to an embodiment of the disclosure may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

An embodiment of the disclosure and terms used therein are not intended to limit the technical features described in the disclosure to specific embodiments, and should be understood to include various modifications, equivalents, or substitutes of the embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as “A or B” “at least one of A and B” “at least one of A or B,” “A, B, or C” “at least one of A, B, and C” and “at least one of A, B, or C,” may include all possible combinations of the items enumerated together in a corresponding one of the phrases. As used herein, such terms as “““1st””” and “““2nd””” or “first” and ““second”” may be used to simply distinguish a corresponding component from another, and does not limit the components in other aspect (e.g., importance or order). It is to be understood that if an element (e.g., a first element) is referred to, with or without the term “operatively” or “communicatively”, as “coupled with,” “coupled to” “connected with” or “connected to” another element (e.g., a second element), it means that the element may be coupled with the other element directly (e.g., wiredly), wirelessly, or via a third element.

As used herein, the term“module” may include a unit implemented in hardware, software, or firmware, and may interchangeably be used with other terms, for example, “logic” “logic block” “part” or “circuitr”. A module may be a single integral component, or a minimum unit or part thereof, adapted to perform one or more functions. For example, according to an embodiment, the module may be implemented in the form of an application-specific integrated circuit (ASIC).

An embodiment of the disclosure may be Implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The storage medium readable by the machine may be provided in the form of a non-transitory storage medium. Wherein, the term “non-transitory” simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to an embodiment of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smartphones) directly. If distributed online, at least part of the computer program product may be temporarily generated or at least temporarily stored in the machine-readable storage medium, such as memory of the manufacture"s server, a server of the application store, or a relay server.

According to an embodiment, each component (e.g., a module or a program) of the above-described components may include a single entity or multiple entities. Some of the plurality of entities may be separately disposed in different components. According to an embodiment, one or more of the above-described components may be omitted, or one or more other components may be added. Alternatively or further, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to an embodiment, operations performed by the module, the program, or another component may be carried out sequentially, in parallel, repeatedly, or heuristically, or one or more of the operations may be executed in a different order or omitted, or one or more other operations may be added.

Further, the structure of the data used in embodiments of the disclosure may be recorded in a computer-readable recording medium via various means. The computer-readable recording medium includes a storage medium, such as a magnetic storage medium (e.g., a ROM, a floppy disc, or a hard disc) or an optical reading medium (e.g., a CD-ROM or a DVD).

Example embodiments of the disclosure have been described above. The above-described embodiments are merely examples, and it will be appreciated by one of ordinary skill in the art various changes may be made thereto without departing from the scope of the present invention. Therefore, the disclosed embodiments should be considered from an illustrative, rather than a limiting, point of view. The scope of the invention is indicated in the claims rather than in the above-described description. All differences within the equivalent range should be construed as being included in the present invention.

What is claimed is:

1. A Radio Frequency (RF) circuit comprising:

a power amplifier;

a switching circuit configured to electrically connect the power amplifier to a first switch in case that an output voltage of the power amplifier does not exceed a threshold voltage and to electrically connect the power amplifier to a terminating resistor in case that the output voltage of the power amplifier exceeds the threshold voltage;

a first electrical path between the power amplifier and the switching circuit; and a first diode connected to a second electrical path from a first point of the first electrical path to the switching circuit, the first diode connected between the first point and the switching circuit.

2. The RF circuit of claim 1, wherein the RF circuit further comprises:

a first resistor connected between the first point and the first diode.

3. The RF circuit of claim 1, wherein the switching circuit includes a Single Pole Dual Throw (SPDT) switch, the SPDT switch including a common port, a first port, and a second port.

4. The RF circuit of claim 3, wherein the common port is connected to the power amplifier through the first electrical path, wherein the first port is connected to the first switch, and wherein the second port is connected to the terminating resistor.

5. The RF circuit of claim 4, wherein the SPDT switch is configured to:

electrically connect the common port to the first port in case that the output voltage does not exceed the threshold voltage, and switch, by electrically connecting the common port to the second port, from the first port to the second port, in case that the output voltage exceeds the threshold voltage.

6. The RF circuit of claim 1, wherein the switching circuit includes a first transistor configured to operate in case that the output voltage of the power amplifier exceeds a preset voltage.

7. The RF circuit of claim 6, wherein the first transistor is configured to electrically connect the power amplifier to the terminating resistor through a path from the first electrical path to the terminating resistor in case that the output voltage of the power amplifier exceeds the threshold voltage.

8. The RF circuit of claim 1, wherein the switching circuit is configured to connect the power amplifier to the terminating resistor inside an antenna switch circuit in case that the output voltage of the power amplifier exceeds the threshold voltage.

9. The RF circuit of claim 1, wherein the RF circuit is configured to:

transmit a control signal received from a transceiver to an antenna switch circuit through the first switch in case that the output voltage of the power amplifier is the threshold voltage or less.

10. The RF circuit of claim 1, wherein the RF circuit further comprises:

a first capacitor connecting the first diode and the switching circuit to a ground.

11. An RF circuit comprises:

a power amplifier;

a switching circuit configured to electrically connect a driving amplifier to a terminating resistor in case that an output voltage of the power amplifier exceeds a threshold voltage, wherein the driving amplifier is electrically connected to an input of the power amplifier;

a first switch configured to receive an output signal of the power amplifier;

a first electrical path between the power amplifier and the first switch; and a first diode connected to a second electrical path from a first point of the first electrical path to the switching circuit, and connected between the first point and the switching circuit.

12. The RF circuit of claim 11, wherein the RF circuit further comprises:

a first diode stack including a plurality of diodes, connecting the first point of the first electrical path to ground, wherein an anode of a diode among the plurality of diodes is electrically connected to the power amplifier.

13. The RF circuit of claim 12, wherein another cathode of a diode among the plurality of diodes included in the first diode stack is electrically connected to an anode of the first diode.

14. The RF circuit of claim 12, wherein the RF circuit further comprises:

a second diode stack including a second plurality of diodes, connecting the first point of the first electrical path to ground, wherein a cathode of a diode among the second plurality of diodes is electrically connected to the power amplifier.

15. The RF circuit of claim 11, wherein the RF circuit further comprises:

a first resistor connected between the first point and the first diode.

16. The RF circuit of claim 11, wherein the switching circuit includes a first transistor configured to operate in case that the output voltage of the power amplifier exceeds a preset voltage.

17. The RF circuit of claim 16, wherein the first transistor is configured to electrically connect the driving amplifier to the terminating resistor in case that the output voltage of the power amplifier exceeds the threshold voltage.

18. The RF circuit of claim 11, wherein the switching circuit is configured to connect the driving amplifier to the terminating resistor inside an antenna switch circuit in case that the output voltage of the power amplifier exceeds the threshold voltage.

19. The RF circuit of claim 11, wherein the RF circuit is configured to:

transmit a control signal received from a transceiver to an antenna switch circuit through the first switch in case that the output voltage of the power amplifier does not exceed the threshold voltage.

20. The RF circuit of claim 11, wherein the RF circuit further comprises:

a first capacitor connecting the first diode and the switching circuit to ground.

* * * * *